United States Patent [19]

Mikome et al.

[11] 3,878,554

[45] Apr. 15, 1975

[54] SEMICONDUCTOR DEVICE

[75] Inventors: Koichi Mikome, Yokohama; Yoshihiro Matsuda; Yoshiyuki Namiki, both of Tokyo, all of Japan

[73] Assignee: Fujitsu Limited, Kawasaki, Japan

[22] Filed: Aug. 27, 1973

[21] Appl. No.: 391,758

Related U.S. Application Data

[63] Continuation of Ser. No. 237,631, March 24, 1972, abandoned.

[30] Foreign Application Priority Data

Mar. 25, 1971 Japan .............................. 46-17535

[52] U.S. Cl. .................357/65; 357/69; 357/71

[51] Int. Cl. ............................................ H01l 5/00

[58] Field of Search...................... 317/234, 5.3, 5.4

[56] References Cited

UNITED STATES PATENTS

| | | | |
|---|---|---|---|
| 3,495,324 | 2/1970 | Guthrie et al. | 29/578 |
| 3,518,506 | 6/1970 | Gates | 317/234 |
| 3,616,348 | 10/1971 | Greig | 204/143 |
| 3,654,526 | 4/1972 | Cunningham et al. | 317/234 |

*Primary Examiner*—Rudolph V. Rolinec
*Assistant Examiner*—E. Wojciechowicz
*Attorney, Agent, or Firm*—Herbert L. Lerner

[57] ABSTRACT

A semiconductor device wherein a beam lead connected to each wiring layer is all formed on a silicon nitride film of a semiconductor wafer surface in a semiconductor device having a multilayer wiring structure on a semiconductor basic board.

4 Claims, 5 Drawing Figures

SEMICONDUCTOR DEVICE

This is a continuation of application Ser. No. 237,631, filed Mar. 24, 1972, now abandoned.

The present invention relates to a new concept for structure of a beam lead type semiconductor device. Conventionally, a beam lead bonding system was proposed for installing or easily accommodating containers when semiconductor devices, such as a transistor, a diode, an accumulation circuit, etc., are manufactured.

A beam lead type semiconductor device based on the present beam lead bonding system has superior reliability compared with a usual semiconductor device based on a wire bonding system, and is easily produced by an automatic process. Furthermore, it can be inserted into a thin film circuit directly.

Figure 1A:
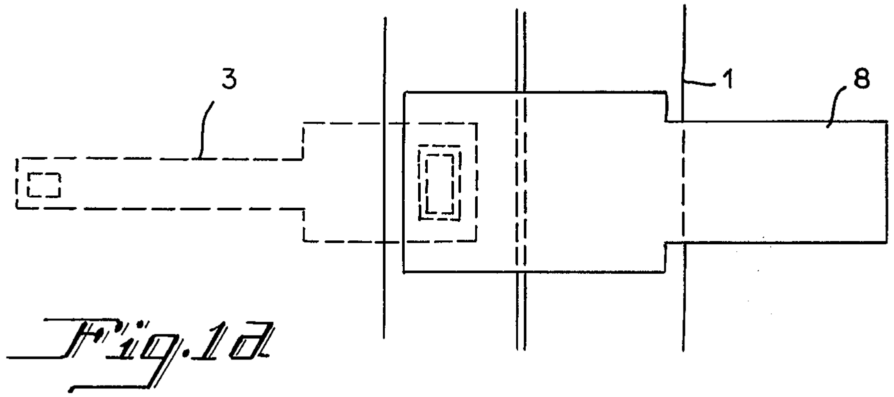
Figure 1B:
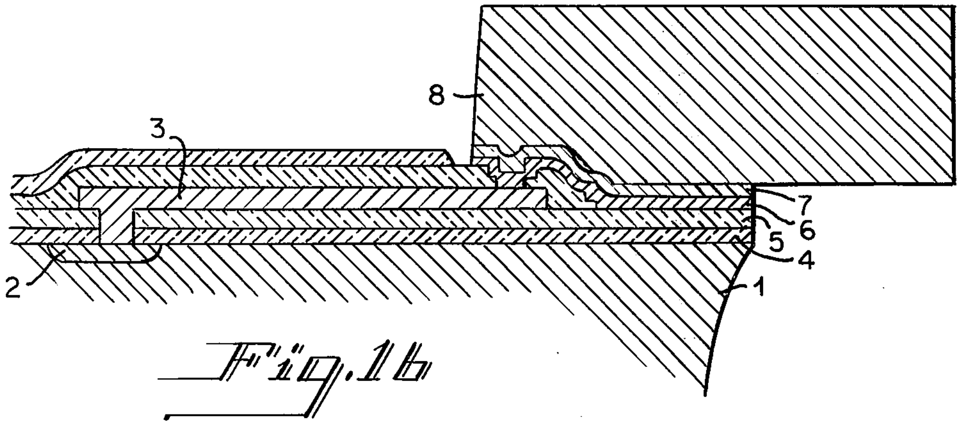
Figure 3:
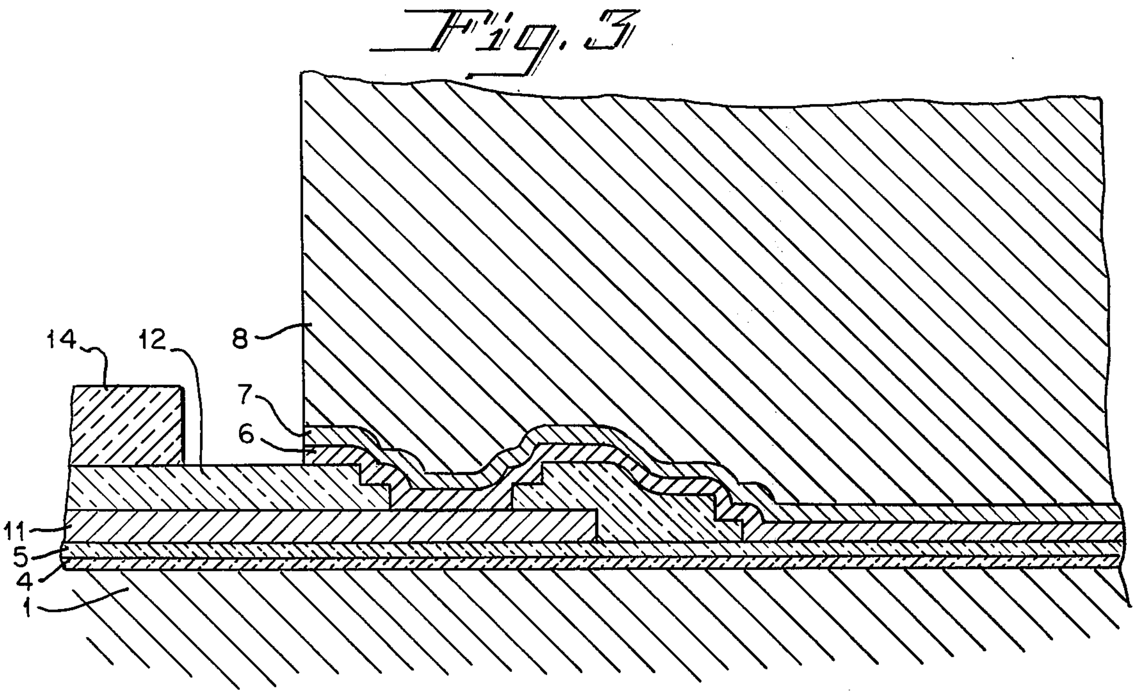
Figure 2A:
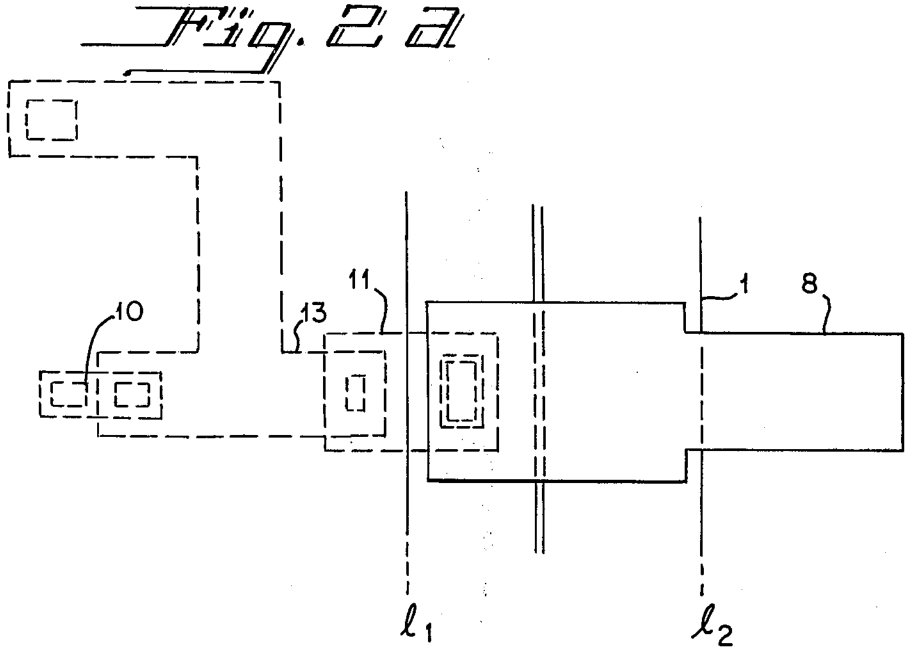
Figure 2B:
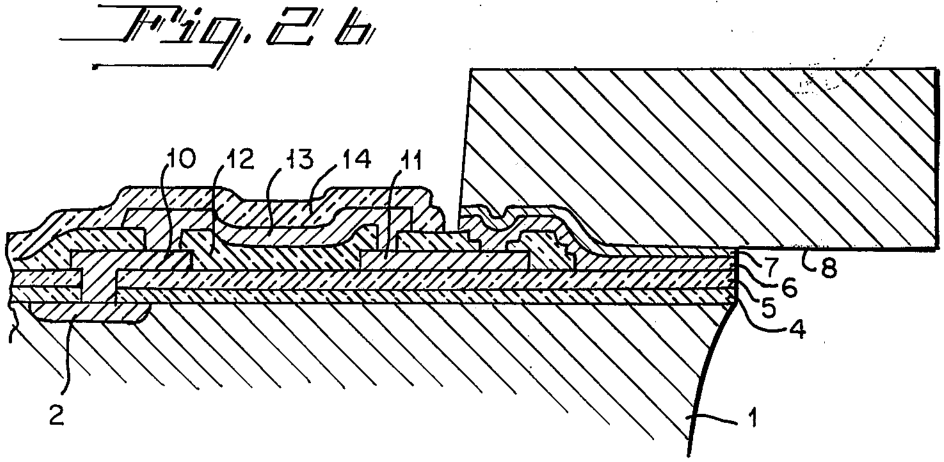

In order that the invention may be readily carried into effect, it will now be described with reference to the accompanying drawings, wherein:

FIGS. 1*a* and 1*b*, respectively, show a ground plane and a sectional view of a semiconductor device of beam lead type of the invention;

FIGS. 2*a* and 2*b*, respectively, show a ground plane and a sectional view of a semiconductor device of beam lead type of the invention; and FIG. 3 shows FIG. 2*b* on an enlarged scale.

Thus, for instance, the beam lead type semiconductor device has a structure as shown in FIGS. 1*a* an 1*b*, wherein the above characteristics can be seen. The FIGS. show in ground plane and sectional view part of a beam lead type accumulation circuit. That is, an impurity diffusion is carried out in the semiconductor wafer 1 in order to form a pn junction. A metal layer 3 is connected to the impurity diffusion area 2. A beam lead 8 is formed in contact with the metal layer 3, via a metal layer 6 and a metal layer 7 from a window provided with an insulating film 4 and an insulating film 5. Metal layer 3 is an aluminum coating.

The insulating film 4 comprises silicon dioxide ($SiO_2$), and is formed by means of either a thermal oxidation of a semiconductor wafer 1 or a gaseous phase reaction of silane ($SiH_4$) and oxygen ($O_2$). The silicon dioxide ($SiO_2$) film is desirable as a mask for an impurity diffusion.

The insulating film 5 comprises silicon nitride ($Si_3N_4$) and is formed by a gaseous phase reaction of silane and ammonia ($NH_3$). The silicon nitride film is desirable as a passivation film, for protecting the semiconductor wafer 1 from an external atmosphere.

A metal layer 6 may be made of titanium and is formed by evaporation or sputtering onto the surface of the insulating film 5. The metal layer 6, has good adherence to the insulating film 5 on which it is provided.

The metal layer 7 is made of platinum or palladium and is formed by means of sputtering on the surface of the metal layer 6. This metal layer 7 is provided in order to prevent an intermetallic compound of the metal layer 3 and a beam lead 8.

The beam lead 8 comprises gold and is formed in the window on the metal layer 7 by an electroplating system wherein the metal layer 7 is used as one electrode. The required plating thickness, for supporting a connection to an external part, is gradually produced. On the other hand, in an accumulation circuit of a semiconductor device, if the degree of accumulation is increased, multilayer wiring will be necessary. However, at this time, many problems occur if a beam lead structure is employed.

A problem of adherence of a beam and a lower insulating film may occur. Titanium is usually used for the lowest layer of a beam. In this case, adhesion of various kinds of insulating films, for the titanium, is as follows. In silicon dioxide prepared by thermal oxidation, adhesion is represented by 3–4 g at a contact area of 160 $\mu \times 80 \mu$, while in phosphoric silicate glass, it is represented by only 2 g at the same contact area. However, 15 g may be obtained in silicon nitride. Therefore, it is most desirable that silicon nitride film be utilized as the insulating film wherein a beam is formed. Other insulating films cannot be expected to have sufficient mechanical strength. Therefore, it is quite difficult to lead out a beam via phosphoric silicate glass of a passivation film. It is not suitable for a multilayer device.

On the other hand, it is very disadvantageous from a manufacturing point of view to lead a beam out from each layer in multilayer wiring. A large number of processes are required. In addition, it is likely to pile up the beams, with a resulting increase in the thickness of the device. In mounting, it is difficult to increase the density.

The object of this invention is to provide a structure for the efficient forming of a beam lead in a semiconductor device having a multilayer wiring structure. A further object is to provide a method of forming a beam with mechanical strong adhesion in a semiconductor device having a multilayer wiring structure. Still a further object of the invention is to provide a method of forming a beam in a semiconductor device having a multilayer wiring structure without increasing the thickness of the device.

The invention will be explained in detail with reference to FIGS. 2*a*, 2*b* and 3, which show part of a structure of a semiconductor element formed simultaneously on a semiconductor wafer of one board.

In the FIGS., 1 is a semiconductor wafer; 2 is an impurity diffusion area; 4 is a silicon dioxide film; 5 is a silicon nitride; 6 is a titanium layer; 7 is a palladium layer; and 8 is a gold beam lead.

The silicon dioxide film 4 is used as a mask, and silicon nitride ($Si_3N_4$) film 5, the thickness of which is 1,500–2,000 A, is formed on the silicon dioxide film 4 by a gas phase reaction of ammonia and monosilane after required impurity diffusion, for instance, after impurity diffusion for forming an emitter area.

A silicon dioxide film with a thickness of 2,500–3,000 A is formed on the silicon nitride layer 5 and is used as a mask for etching of the silicon nitride film.

After this, a window for leading an electrode from the emitter area is formed on the required part of the silicon nitride film at the location of the above-mentioned impurity diffusion emitter area by a photoetching process wherein the silicon dioxide film is used as a mask. The silicon dioxide mask is then removed above said silicon nitride film, and an aluminum layer, which is the first conductive layer, is coated to a thickness about 6,000 A, by evaporation on the surface of silicon nitride film. Thereafter, the aluminum layer is formed into a required wiring pattern by photoetching. At this time, an external leading out wiring pattern 11 is also formed along with a wiring pattern 10 leading out an electrode of the emitter region.

A phosphoric silicate glass layer 12 (PSG) is then produced at a thickness about 8,000A over its entire surface, as both an insulating film or layer and a passivation layer. The quantity of phosphorus is about 20 percent as phosphorus pentoxide. The phosphiric silicate glass 12 is formed by means of a gas phase reaction by supplying phosphine ($PH_3$), monosilane ($SiH_4$), oxygen ($O_2$) and nitrogen ($N_2$) as a carrier gas in order to have a 20 percent phosphine discharge ratio to phosphine and monosilane, $PH_3/(PH_3 + SiH_4)$.

A window for leading a conductive layer out from the conductive layers 10 and 11 of the first layer is formed in the phosphoric silicate glass 12 by photoetching. An aluminum layer which is a conductive layer of the second layer is coated 1 $\mu$ thick upon the phosphoric silicate glass 12 by evaporation. At this time, aluminum is coated also in a window, thus connecting the first layer to the second layer.

The aluminum layer is then formed into a wiring pattern 13 by photoetching. At this time, a wiring pattern 10 from the emitter area is conductively connected to the external lead out wiring pattern 11 by the conductive layer 13 of the second layer. The conductive layer 13 of the second layer is extended in another direction, connecting it to another active element or passive element.

At this point, one of the results of this invention becomes clear. That is, in the semiconductor device of multilayer wiring structure, the conductive layer 13 above the second layer is connected to the conductive layer of the first layer, and the thickness of the device can be reduced without a lead out beam in the layer above the second layer. This permits the manufacture of a small size device wherein a semiconductor device itself and a semiconductor device are built in.

A phosphoric silicate glass layer 14 having a thickness of about 12,000 A is produced over the entire surface as then an insulating layer and a passivation layer. The phosphoric silicate glass 14 is then photoetched up to the line *l* of FIG. 2*a*, and the phosphoric silicate glass 12 below is exposed. The external lead out wiring pattern 11 is beneath the phosphoric silicate glass 12 of the first layer.

A window is then formed at the phosphoric silicate glass of the first layer reexposed again by photoetching, and part of the external leading out wiring pattern 11 is seen. At this time, the photoetching should be divided into two stages to facilitate the following processes. As shown in the drawing, the window thickness is assumed to be 0.4 $\mu$ and 0.8 $\mu$, that is, it is assumed to be formed in stages. The surface area of the side wall of the window is increased. This permits increasing of the contact area of the metal layer to be formed in the following process, and provides increased mechanical strength.

At the same time, phosphoric silicate glass 12 of the first layer is photoetched, only at that part, right of line *l* 2 shown in FIG. 2*a*, and the silicon nitride film 5 of the low layer is exposed. Titanium layer 6 is then coated in a thickness of about 3,000 A over the surface by electronic beam evaporation, etc. The titanium layer forms the lowest metal layer of the beam, and facilitates the adherence for the semiconductor basic board of a beam. That is, adhesion of the titanium and silicon nitride film is increased 15 g for the area of 160 $\mu \times 80\ \mu$. Then, palladium film 7 is coated in a thicknes of about 3,000 A on the titanium layer 6 by electronic beam evaporation.

The titanium and palladium layers are used to prevent an intermetallic compound between the aluminum wiring pattern and gold beam from forming (referred to as purple plague) and to prevent a decrease of the mechanical strength.

In addition, titanium and palladium can be coated by a conventional sputtering method. However, they can be considered to be undesirable because an alteration layer is formed between titanium and phosphoric silicate glass, and etching becomes difficult.

The palladium layer 7 is then photoetched to the required beam form. An etching fluid containing 3 cc hydrochloric acid added to 300 cc nitric acid and heated to approximately 40°–50°C is applied. The prepared palladium layer 7 is exposed only at the surfaces, except that it is coated by a photo resist, such as for instance, by KTFR. Gold is then plated on the exposed palladium layer up to 15–17 $\mu$ in thickness. The titanium layer 6 is used as one electrode, and the gold beam 8 is formed. "Temperex HD", which is available on the market as gold plating fluid from the Sel-Rex Company in the U.S.A., can be used as a gold plating bath, although other gold plating baths can be used. The remaining photo resist is removed by trichloroethylene, xylene, etc., and the titanium layer is exposed. The titanium layer, coated except on the gold beam 8, is then removed by etching. This is feasible by dissolving 3 g ethylenediamine tetraacetic acid hexaethyl hydrogen (EDTA–4H) in 300 cc, 37 percent hydrogen peroxide solution and heating it to 45°—50 °C. At this time, it is recommended that ultrasonic waves be used in conjunction with the etching fluid in order to increase the efficiency. A 30 minute incubation processing at 300° to 400°C is then carried out for the semiconductor device, wherein the gold beam 8 is formed within the nitrogen atmosphere. The electrical resistance of each metal layer, especially that of aluminum and titanium, is then lowered. After this, photoetching at the back of the semiconductor basic board, that is, the plane wherein the beam is not formed, is used to separate each semiconductor chip of a beam lead type from the semiconductor basic board.

At this point, the efficiency of the invention is again obvious. That is, in the semiconductor device with a multilayer wiring structure, since the conductive layers above the second layer are all connected to the first layer, and the entire beam is formed on the silicon nitride film with a strong adherence for the titanium, the mechanical strength of the beam is sufficient.

In the above-mentioned example, although phosphoric silicate glass is used as a passivation film, other insulation, for instance aluminum oxide ($Al_20_3$) also can be used.

In addition, it is not necessary that the structure of the gold layer in the above example always be the same as the example. It goes without saying that titanium, platinum, gold, etc., also can be used as the beam structure.

What is claimed is:

1. A semiconductor device comprising a first insulating film covering a surface of a semiconductor substrate; a second insulating film covering the first insulating film; an electrode window penetrating the first and second insulating films to expose a surface region of the semiconductor substrate; a first wiring layer extending from the semiconductor substrate through the electrode window and disposed on the second insulating film; a third insulating film disposed on the first wiring layer; a second wiring layer disposed on the third insulating film and extending onto the second insulating film; and a beam lead electrode disposed on the second insulating film and electrically connected to the first wiring layer.

2. A semiconductor device as claimed in claim 1, wherein the first insulating film comprises silicon dioxide, the second insulating film comprises silicon nitride and the third insulating film comprises phosphorus silicate glass.

3. A semiconductor device as claimed in claim 1, wherein a wiring pattern for leading out is formed where the beam lead connected to the first wiring layer is led out and formed.

4. A semiconductor device as claimed in claim 3, wherein the wiring pattern for leading out consists of the same material as the first wiring layer and is formed on the same plane.

* * * * *